United States Patent
Yang

(10) Patent No.: US 7,948,079 B2
(45) Date of Patent: *May 24, 2011

(54) METHOD OF MANUFACTURING HYBRID STRUCTURE OF MULTI-LAYER SUBSTRATES AND HYBRID STRUCTURE THEREOF

(75) Inventor: Chih-kuang Yang, Hsin-Chu (TW)

(73) Assignee: Princo Corp., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/549,289

(22) Filed: Aug. 27, 2009

(65) Prior Publication Data

US 2009/0314524 A1    Dec. 24, 2009

Related U.S. Application Data

(62) Division of application No. 11/856,867, filed on Sep. 18, 2007, now Pat. No. 7,687,312.

(51) Int. Cl.
*H01L 29/40* (2006.01)

(52) U.S. Cl. ........... 257/734; 257/E27.111; 257/E25.03

(58) Field of Classification Search .......... 257/734, 257/678, 687, 700, E27.137, E27.001, E27.111, 257/E25.03; 174/254; 428/457
See application file for complete search history.

(56) References Cited

U.S. PATENT DOCUMENTS

| | | | |
|---|---|---|---|
| 6,222,136 B1 | 4/2001 | Appelt et al. | |
| 6,423,614 B1 | 7/2002 | Doyle | |
| 6,693,029 B2 | 2/2004 | Iijima et al. | |
| 2005/0046536 A1 | 3/2005 | Ritter et al. | |
| 2005/0266660 A1 | 12/2005 | Behammer | |
| 2006/0107506 A1 | 5/2006 | Doffing et al. | |
| 2006/0199382 A1 | 9/2006 | Sugiyama et al. | |
| 2008/0138575 A1* | 6/2008 | Yang .................. | 428/137 |

FOREIGN PATENT DOCUMENTS

| | | |
|---|---|---|
| CN | 1351815 | 5/2002 |
| CN | 1186971 | 1/2005 |
| CN | 1575094 | 2/2005 |
| CN | 1652663 | 8/2005 |
| CN | 1703136 | 11/2005 |
| CN | 1231965 | 12/2005 |
| CN | 1713802 | 12/2005 |
| CN | 2786910 | 6/2006 |
| JP | 05-243741 | 9/1993 |
| JP | 07-058431 | 3/1995 |
| JP | 08-236937 | 9/1996 |
| JP | 2002314257 | 10/2002 |
| TW | 466650 | 12/2001 |
| TW | 592019 | 6/2004 |
| TW | I232574 | 5/2005 |

* cited by examiner

*Primary Examiner* — Thomas L Dickey
*Assistant Examiner* — Nikolay Yushin

(57) ABSTRACT

Disclosed is a method of manufacturing a hybrid structure of multi-layer substrates. The method comprises steps of: separating a border district of at least one metal layer connecting with a border district of the corresponding dielectric layer from adjacent metal layers and adjacent dielectric layers for each multi-layer substrate and connecting a separated border of a metal layer of one multi-layer substrate with a separated border district of a metal layer of another multi-layer substrate to form a connection section. The hybrid structure comprises at least a first multi-layer substrate and a second multi-layer substrate. At least one first metal layer is connected with at least one second metal layer to form a connection section.

18 Claims, 16 Drawing Sheets

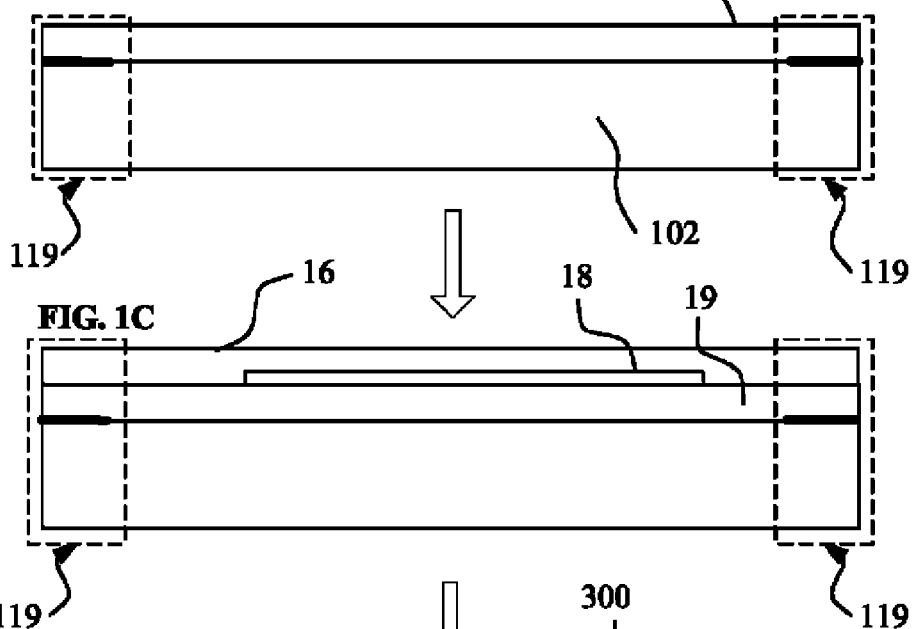
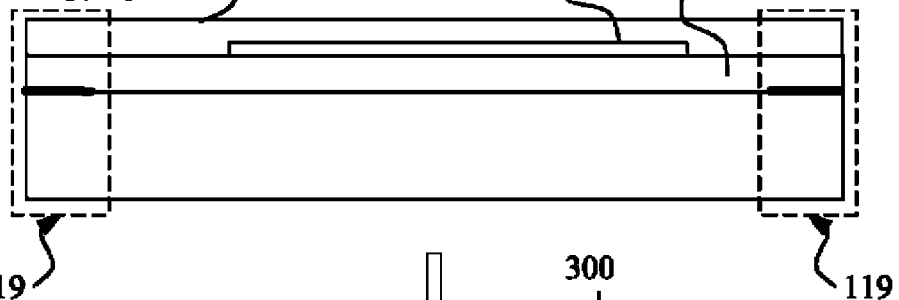
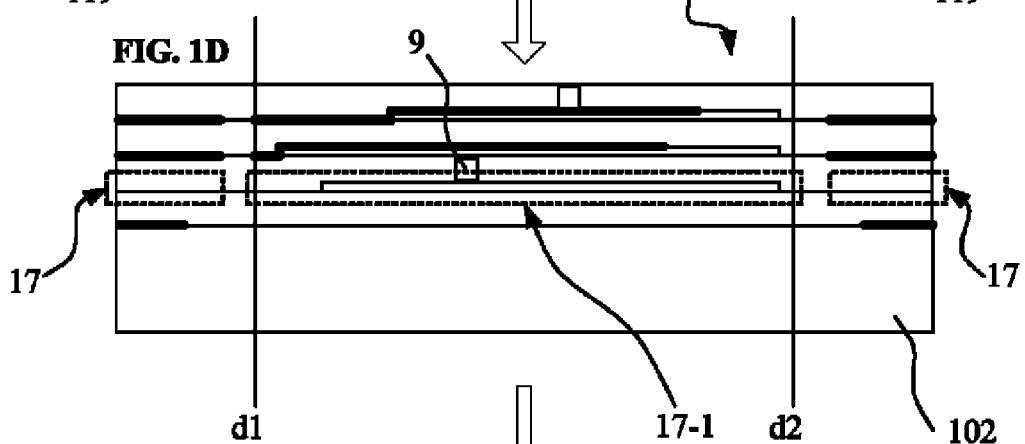
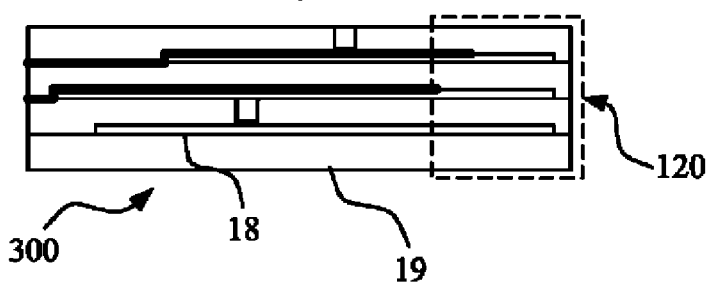

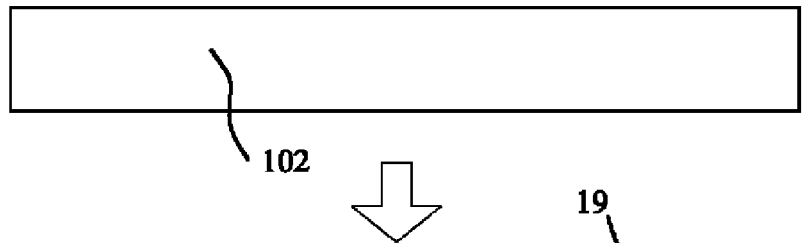
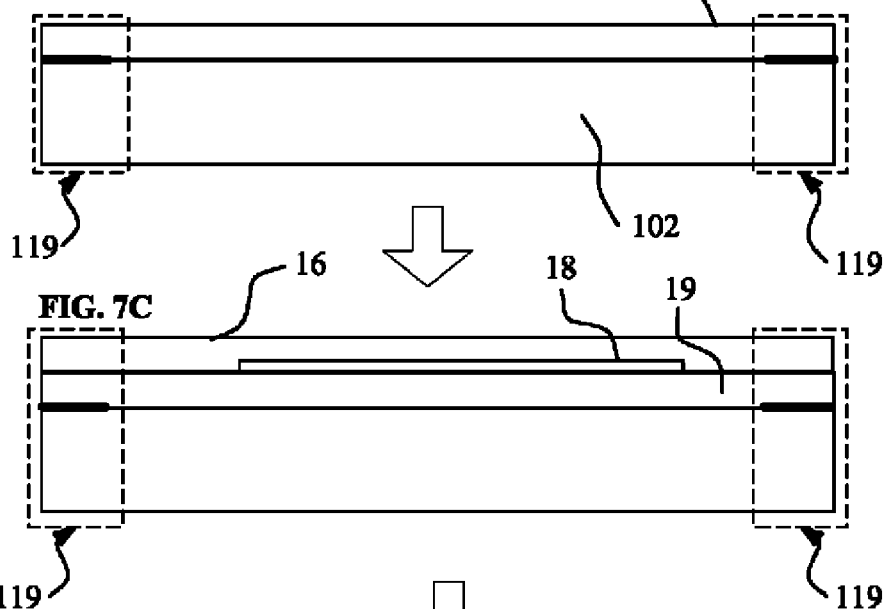
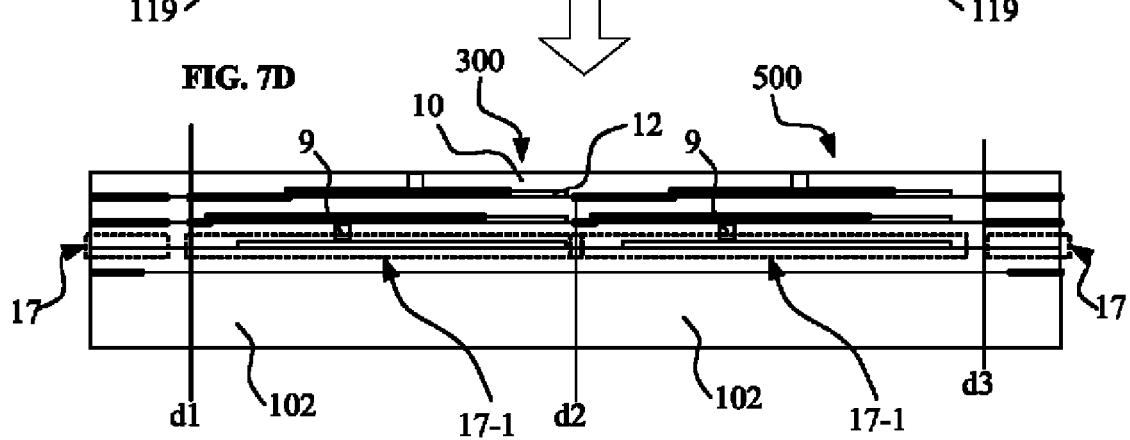
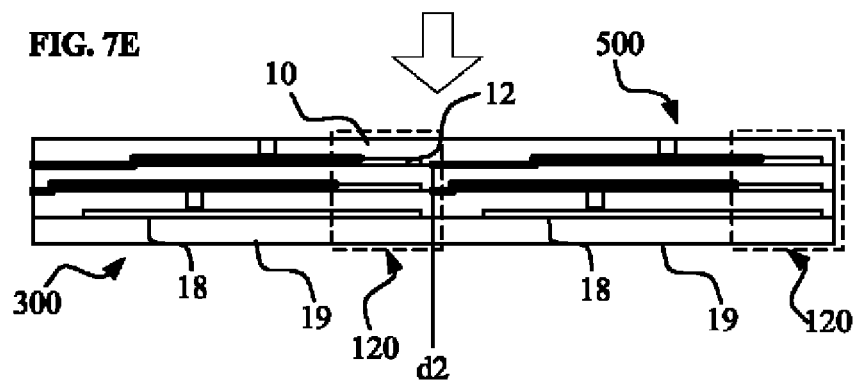

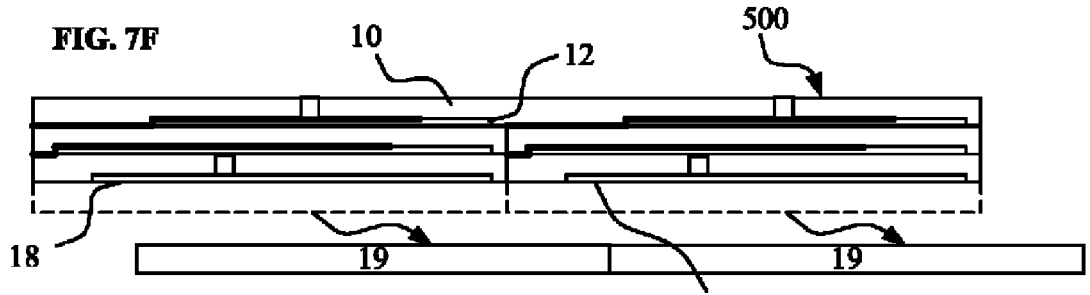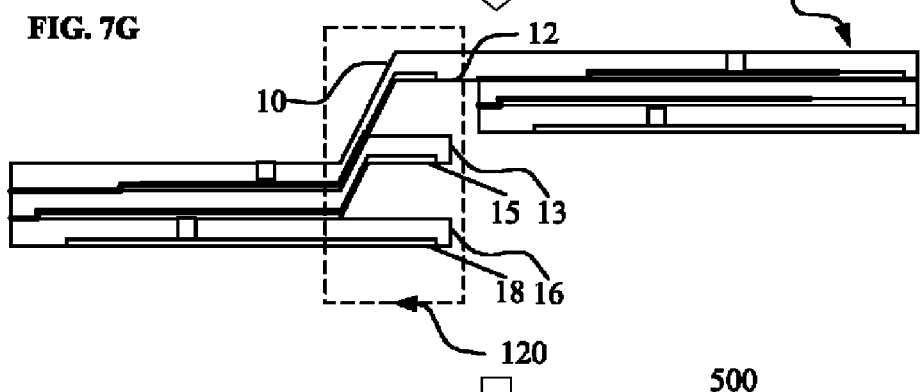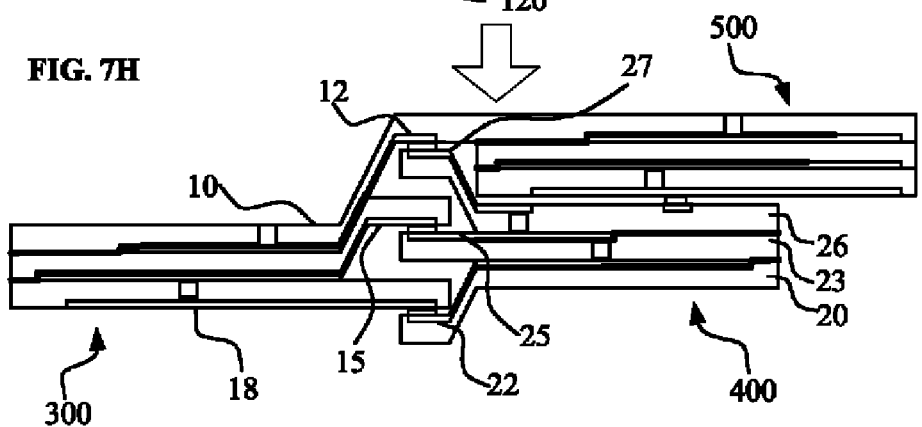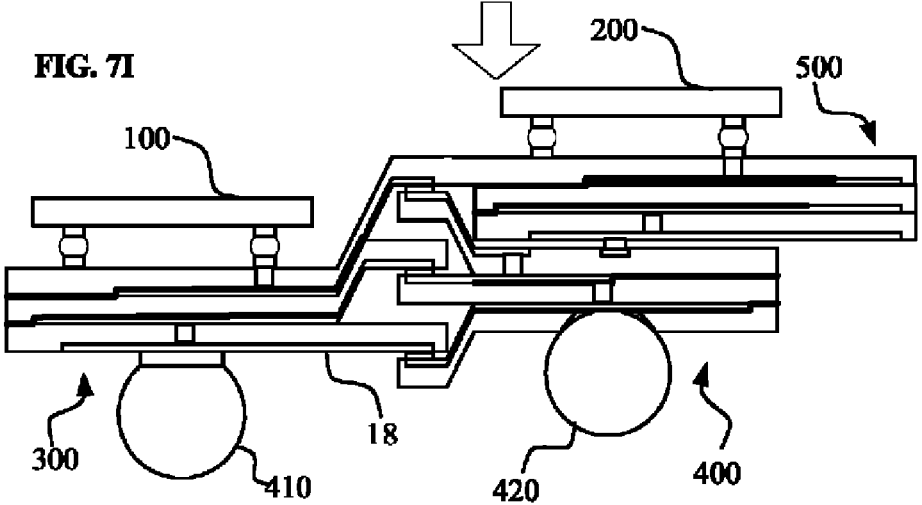

METHOD OF MANUFACTURING HYBRID STRUCTURE OF MULTI-LAYER SUBSTRATES AND HYBRID STRUCTURE THEREOF

CLAIM OF PRIORITY

This application is a divisional of U.S. patent application Ser. No. 11/856,867 filed on Sep. 18, 2007 now U.S. Pat. No. 7,687,312.

FIELD OF THE INVENTION

The present invention generally relates to a method of manufacturing a hybrid structure of multi-layer substrates and hybrid structure thereof, and more particularly to a method of manufacturing a hybrid structure of several multi-layer substrates and the hybrid structure for different kinds of multi-layer substrates which can be applied to a flexible package for different kinds of chip devices.

BACKGROUND OF THE INVENTION

Miniaturization of all electronic products is an unavoidable trend in this modern world. While the scales of the semiconductor chips continuously get smaller, the scale of the related technology for packaging needs to be microminiaturized to follow the scale of the semiconductor chip is also unavoidably getting smaller. Today, because the integration of integrated circuits has been greatly increased, using a multi-layer substrate to package different kinds of chip devices is necessary to integrate different kinds of functions to obtain a high performance integration system consequentially. For example, an integration system may comprise many kinds of chip devices, such as a logic circuit component, a memory, an analog component, an optoelectronic component, a microelectric mechanical component or a luminous component. Generally, the kinds of chip devices need to connect with each other through one shared package substrate (such as a mainboard) according to prior arts. That is, if one chip device can be connected to another chip device directly, then the package integration can be increased to microminiaturize the entire system further. A Stacked Chip Scale Package (SCSP) is proposed to package several chips nowadays, and it is called a 3D-package. However, such a 3D-package concept is limited in a rigid system package.

For meeting the variety of modern electronic production, a flexible multi-layer substrate or a non-flat substrate can be used for high density package. According to prior arts, the connection for two independent multi-layer substrates is established through connectors or through one shared package substrate. Therefore, for corresponding to a flexible or irregular package to increase integration complexity and reducing package volume, even applying for a System-In-Package, connection becomes a great topic and a challenge for the package technology today.

Therefore, development of a method of manufacturing a hybrid structure of the multi-layer substrates and the hybrid structure thereof to connect different kinds of chip devices directly without a shared package substrate, which will reduce the package volume of the entire system, hence increases the package integration and provides a flexible package. Accordingly, microminiaturization of the entire system can be achieved.

SUMMARY OF THE INVENTION

An objective of the present invention is to provide a method of manufacturing a hybrid structure of multi-layer substrates and the hybrid structure thereof to connect different kinds of chip devices directly without a shared package substrate for increasing the package integration and microminiaturizing an entire system of the chip devices and the multi-layer substrates.

Another objective of the present invention is to provide a method of manufacturing a hybrid structure of multi-layer substrates and the hybrid structure thereof to reduce package volume of the entire system for increasing the package integration and provide a flexible package.

The method of manufacturing a hybrid structure of multi-layer substrates comprises steps of:

(1) separating a border district of at least one metal layer connecting with a border district of the corresponding dielectric layer from adjacent metal layers and adjacent dielectric layers for each multi-layer substrate; and (2) connecting a separated border district of a metal layer of one multi-layer substrate with a separated border district of a metal layer of another multi-layer substrate to form a connection section.

The method of the present invention further comprises a step (a) of providing a carrier to form either of the multi-layer substrates thereon before the separating step (1). The step of forming the multi-layer substrate comprises of the following:

(b) coating a dielectric layer on a surface of the carrier;

(c) forming at least one VIA at the dielectric layer and one metal layer on the dielectric layer and then coating another dielectric layer;

(d) repeating step (c) to form the multi-layer substrate; and (e) dividing border districts of the carrier and the multi-layer substrate to separate the multi-layer substrate from the carrier.

The method of the present invention further comprises a step of implementing an interface adhesion enhancing process on the border districts of the surface of the carrier to increase adhesion intensity thereon before coating the another dielectric layer during the step (b). Alternatively, the method of the present invention can comprise a step of implementing an interface adhesion enhancing process on the surface of the carrier to increase adhesion intensity between the dielectric layer and the carrier and then coating one more dielectric layer on the surface of the dielectric layer during the same step (b). Accordingly, the multi-layer substrate is separated from the carrier by dividing the dielectric layer and the one more dielectric layer.

Before or after the step (2), the method of the present invention can further comprises a step of connecting a first outer surface and a second outer surface of the multi-layer substrates. The connecting step is to connect a plurality of chip devices, a third substrate and the multi-layer substrates.

The hybrid structure of multi-layer substrates of the present invention comprises at least a first multi-layer substrate and a second multi-layer substrate. The first multi-layer substrate stacks up a plurality of first metal layers and a plurality of first dielectric layers alternately. A border district of at least one first metal layer connects with a border district of the corresponding first dielectric layer. The aforesaid border districts are separated from adjacent first metal layers and adjacent first dielectric layers. The second multi-layer substrate stacks up a plurality of second metal layers and a plurality of second dielectric layers alternately. A border district of at least one second metal layer connects with a border district of the corresponding second dielectric layer. The aforesaid border districts are separated from adjacent second metal layers and adjacent second dielectric layers.

Meanwhile, at least one first metal layer is connected with at least one second metal layer to form a connection section to realize the hybrid structure of the multi-layer substrates of the present invention.

The hybrid structure of the present invention further comprises a first chip device to be connected with the first outer surface of the first multi-layer substrate and further comprises a second chip device to be connected on the first outer surface of the second multi-layer substrate. Either the first chip device or the second chip device can be a logic circuit component, a memory, an analog component, an optoelectronic component, a micro-electric mechanical component or a luminous component.

The hybrid structure of the present invention further comprises a third substrate to connect the first multi-layer substrate or the second multi-layer substrate. All of the first multi-layer substrate, the second multi-layer substrate and the third substrate can be flexible substrates.

According to the method of manufacturing the hybrid structure of the multi-layer substrates and the hybrid structure of the present invention, directly connecting different kinds of chip devices can be realized. Moreover, the present invention can reduce the package volume of the entire system for increasing the package integration and provide a flexible package for application of a flexible electronic system.

BRIEF DESCRIPTION OF THE DRAWINGS

FIG. 1A to FIG. 1I illustrate a flowchart of a method of manufacturing the hybrid structure of multi-layer substrates according to step (a) to step (h) in a first embodiment of the present invention;

FIG. 7A to FIG. 7I illustrate a flowchart of a method of manufacturing the hybrid structure of multi-layer substrates according to step (a) to step (h) in a seventh embodiment of the present invention;

DETAILED DESCRIPTION OF THE INVENTION

Figure 1F:
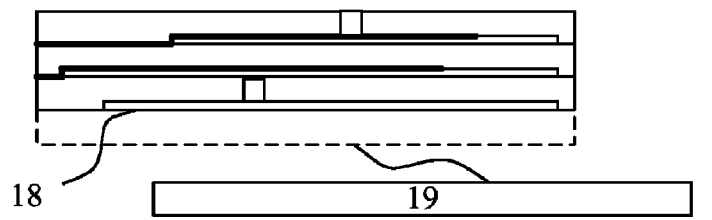
Figure 1G:
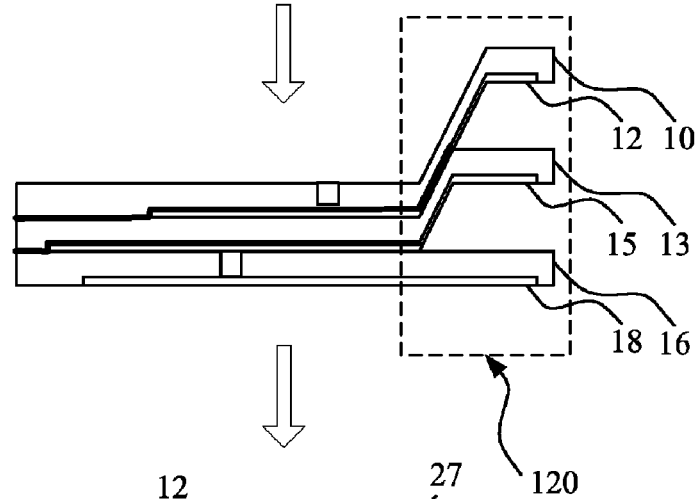
Figure 1H:
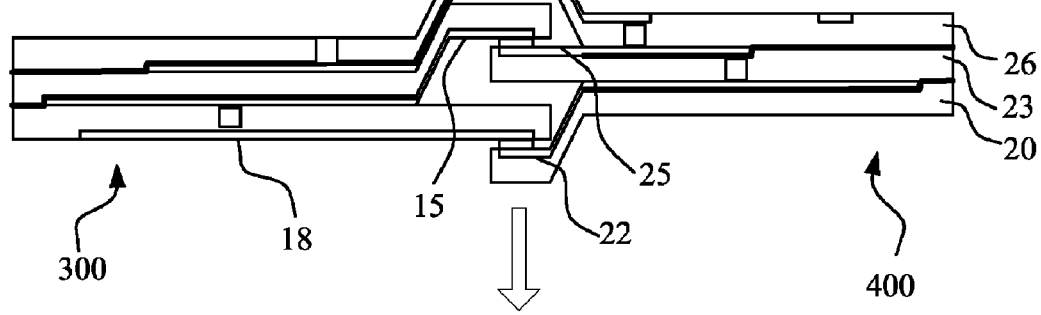
Figure 1I:
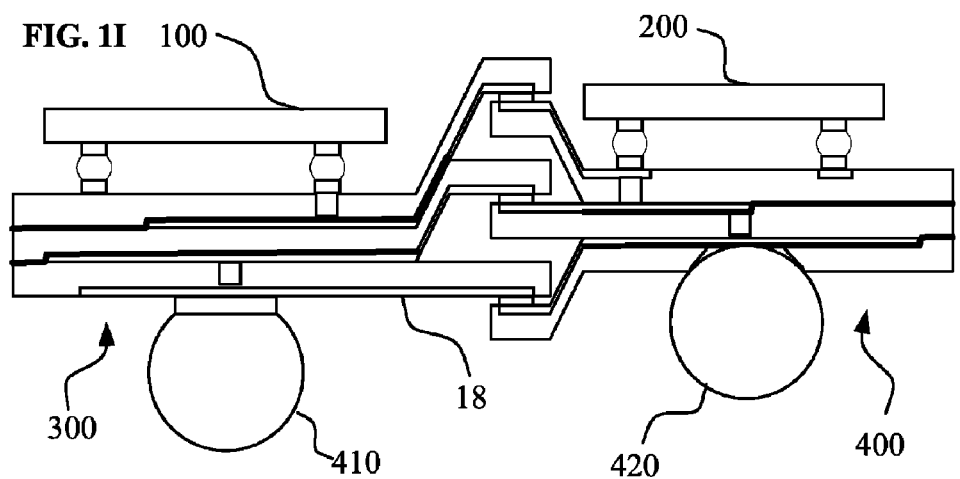

Please refer to FIG. 1A to FIG. 1I, which illustrate a flowchart of a method of manufacturing the hybrid structure of multi-layer substrates according to step (a) to step (h) in a first embodiment of the present invention. The method of manufacturing the hybrid structure of multi-layer substrates according to the first embodiment of the present invention comprises steps below:

FIG. 1A shows step (a), providing a carrier 102 to form one of the multi-layer substrates (taking the first multi-layer substrate 300 for example) thereon. In addition, the present invention can also provide a device wafer, which includes a plurality of chip devices instead of the carrier 102. The coming several steps can do some modification accordingly to form the multi-layer substrate directly on the chip device, and then the connecting step shown in FIG. 1I can be omitted;

FIG. 1B shows step (b), implementing an interface adhesion enhancing process on border districts 119 of the carrier 102 to increase adhesion intensity between the carrier 102 and a first dielectric layer 19 corresponding to the border districts 119 of the carrier 102;

FIG. 1C shows step (c), forming a necessary VIA 9 (shown in FIG. 1D) or more at the first dielectric layer 19 and a first metal layer 18 on the first dielectric layer 19 and then coating another first dielectric layer 16;

FIG. 1D shows step (d), repeating step (c) to form the first multi-layer substrate 300 but an interface adhesion enhancing process is not implemented on districts 17, 17-1;

FIG. 1E shows step (e), dividing border districts 119 of the carrier 102 and the first multi-layer substrate 300 thereon alongside the edges of separated border districts 120 (alongside the vertical lines d1, d2 shown in FIG. 1D) to separate the first multi-layer substrate 300 from the carrier 102;

FIG. 1F shows step (e'), removing the first dielectric layer 19 adjacent to the carrier 102 to reveal the corresponding first metal layer 18 of the first dielectric layer 19;

FIG. 1G shows step (f), separating the border districts of the first metal layers connecting with the border districts of the corresponding first dielectric layers (10 connecting with 12, 13 connecting with 15, 16 connecting with 18) from one another to be ready to form a connection section 120;

FIG. 1H shows step (g), connecting the separated border districts of the first metal layers 12, 15, 18 of the first multi-layer substrate 300 with the separated border districts of the second metal layers 22, 25, 27 of the second multi-layer substrate 400 to form the connection section 120, and hence complete the hybrid structure of multi-layer substrates of the present invention. Before the formation of the connection section 120, the second multi-layer substrate 400 has already been placed upside down to make the metal layers 27, 25, 22 above the second dielectric layers 26, 23, 20. The interconnection between the first metal layers 12, 15, 18 and the second metal layers 27, 25, 22 respectively can use bonding methods such as tin finish bonding, Eutectic bonding, Anisotropic Conductive Film bonding, Gold-Gold bonding or Gold-Copper bonding; and FIG. 1I shows step (h), connecting a first outer surface and a second outer surface of the multi-layer substrates 300, 400 with a first chip device 100, a second chip device 200 and a third substrate. The connect method can be BGA package, LGA package, PGA package or Wire Bond Package. Moreover, the sequence of the step (g) and the step (h) can be exchanged but there is no effect on the hybrid structure of multi-layer substrates of the present invention and the function thereof.

Figure 2A:
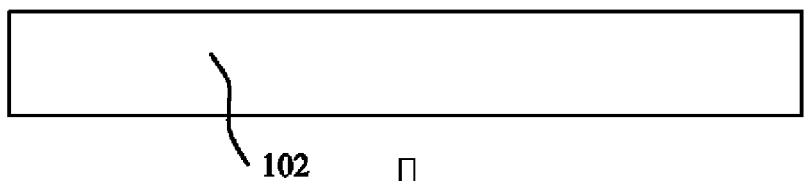
FIG. 2A to FIG. 2I illustrate a flowchart of a method of manufacturing the hybrid structure of multi-layer substrates according to step (a) to step (h) in a second embodiment of the present invention.
Figure 2B:
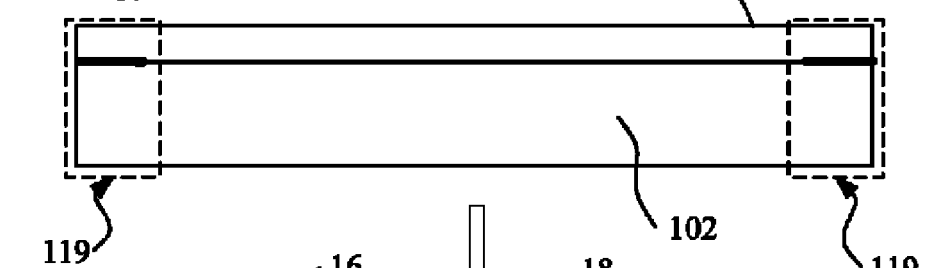
Figure 2C:
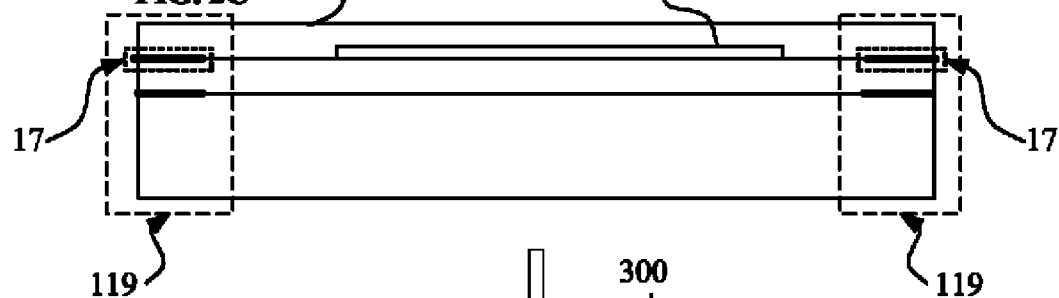
Figure 2D:
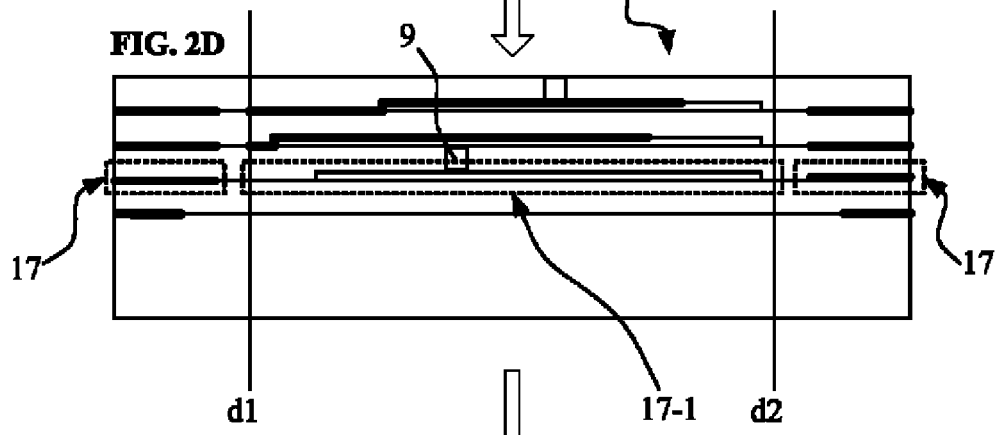
Figure 2E:
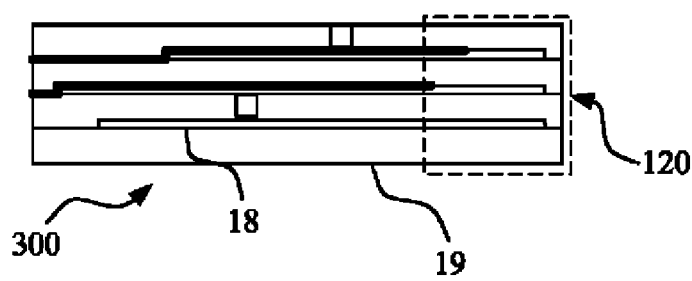
Figure 2F:
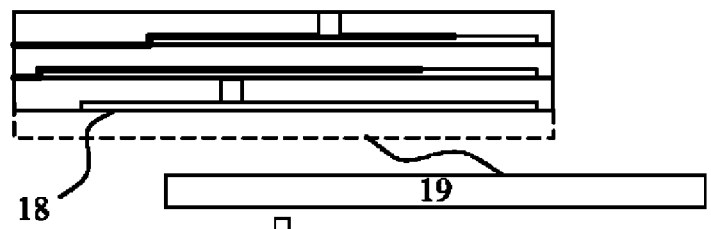
Figure 2G:
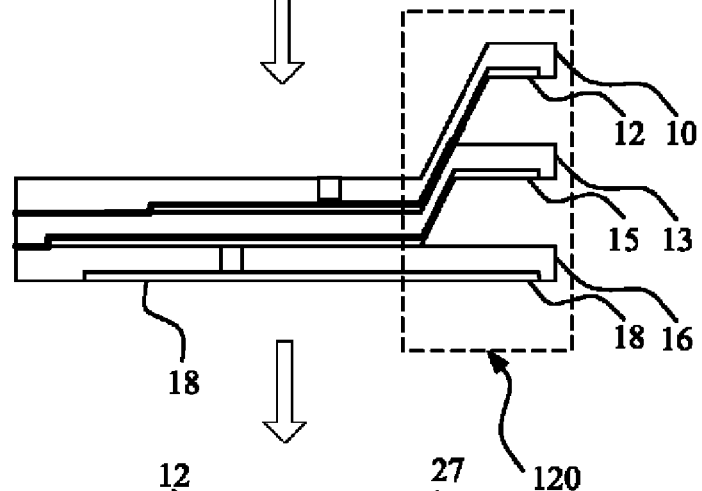
Figure 2H:
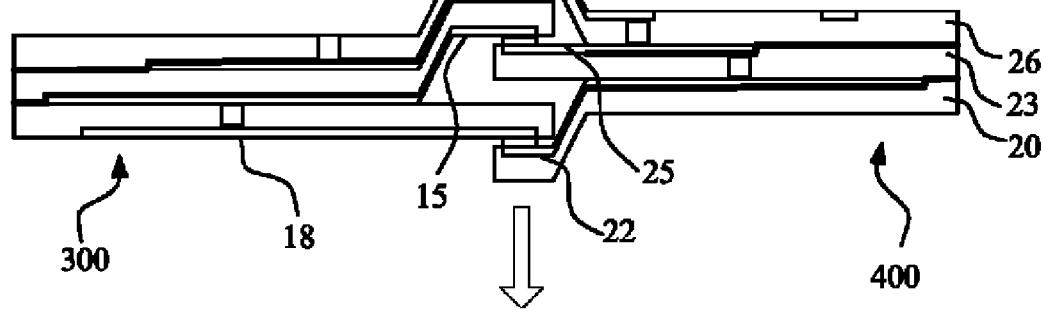
Figure 2I:
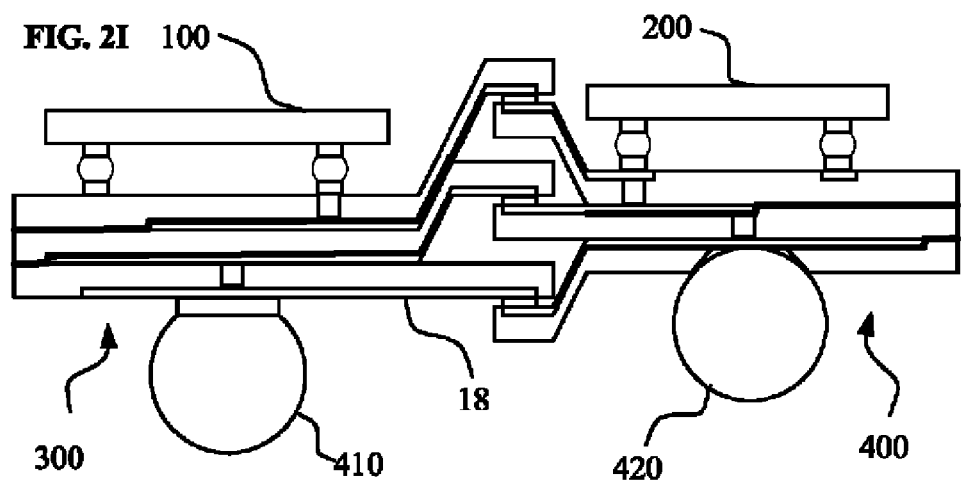

Please refer to FIG. 2A to FIG. 2I. FIG. 2C and FIG. 2D illustrate different steps (c) and (d) of a second embodiment from the first embodiment according to the present invention. Besides the steps (c) and (d) which are different, the steps shown in FIGS. 2A, 2B, 2E, 2F, 2G, 2H and 2I are the same as described in the first embodiment.

FIG. 2C shows step (c), in the second embodiment, an interface adhesion enhancing process is implemented on districts 17 to increase adhesion intensity between the first dielectric layer 16 and the first dielectric layer 19 coated in step (b) before coating the first dielectric layer 16. The aforesaid interface adhesion enhancing process can decrease the possibility that a separation between the dielectric layers 16, 19 or a deformation of the dielectric layers 16, 19 may happen and the dielectric layers 16, 19 may become unfit with each other during the coming step (d) shown in FIG. 2D, therefore, leading to an improved manufacturing the hybrid structure of multi-layer substrates.

Moreover, the sequence of the step (g) and the step (h) can be exchanged but there is no effect on the hybrid structure of multi-layer substrates of the present invention and the function thereof.

Figure 3A:
FIG. 3A to FIG. 3H illustrate a flowchart of a method of manufacturing the hybrid structure of multi-layer substrates according to step (a) to step (h) in a third embodiment of the present invention.
Figure 3B:
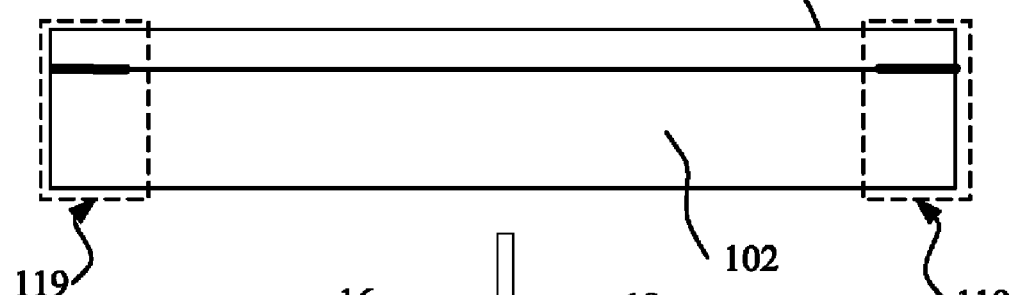

Please refer to FIG. 3A to FIG. 3H. FIG. 3C to FIG. 3H illustrate different step (c) to step (g) of a third embodiment from the second embodiment according to the present invention. Besides the step (c) to the step (h), the steps shown in FIG. 3A and FIG. 3B are the same as described in the second embodiment.

Figure 3C:
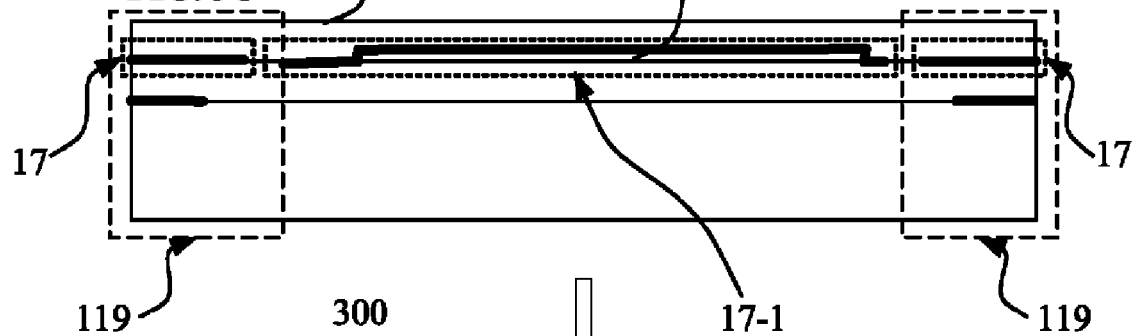
Figure 3D:
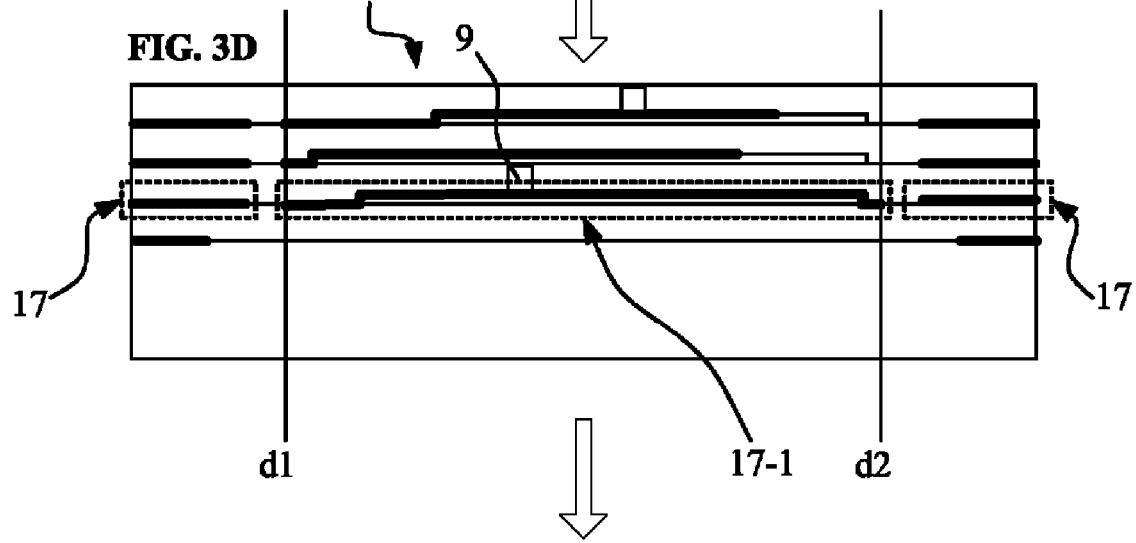
Figure 3E:
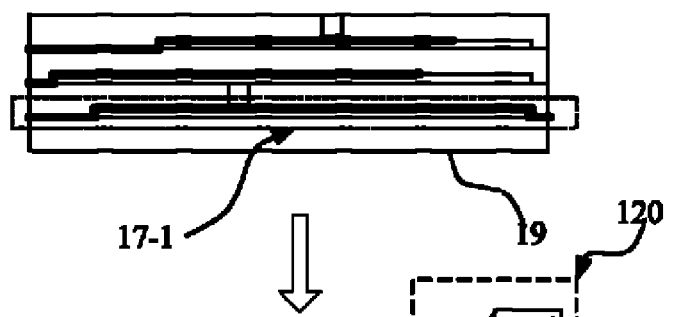

FIG. 3C shows step (c), in the third embodiment, an interface adhesion enhancing process is implemented on districts 17, 17-1 to increase adhesion intensity in these districts between the first dielectric layers 16, 19 before coating the first dielectric layer 16. The aforesaid interface adhesion enhancing process can decrease the possibility that a separation between the first dielectric layers 16, 19 or a deformation of the first dielectric layers 16, 19 may happen and the first dielectric layers 16, 19 may become unfit with each other during the coming step (d) shown in FIG. 3D.

Figure 3F:
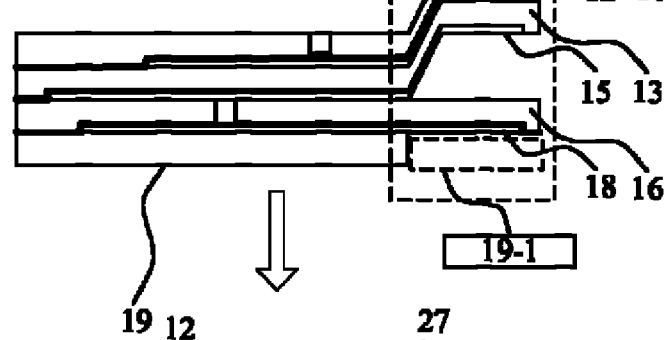
Figure 3G:
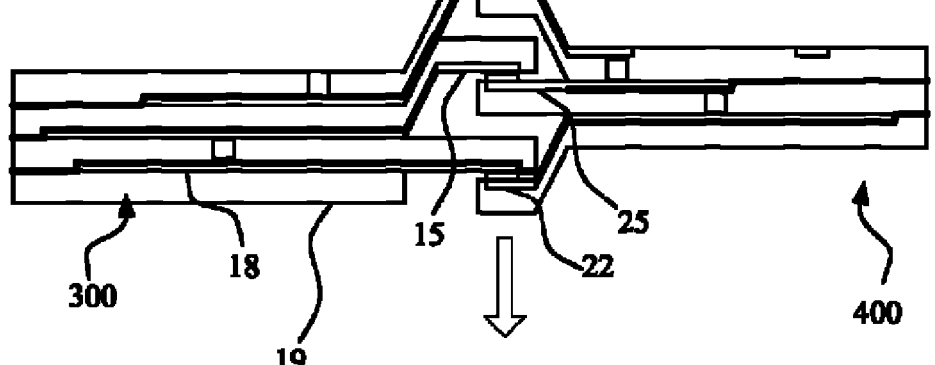
Figure 3H:
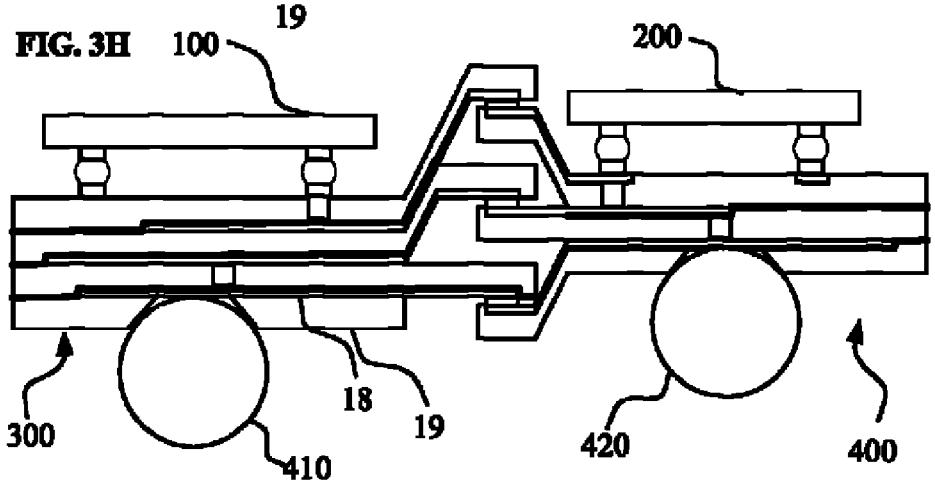

After the step (e), the step (e') is skipped and the step (f) is executed directly after the step (e). The first dielectric layer 19 adjacent to the carrier 102 is not removed;

FIG. 3F shows step (f), separating the border districts of the first metal layers connecting with border districts of the corresponding first dielectric layers (10 connecting with 12, 13 connecting with 15, 16 connecting with 18) from one another ready to form a connection section 120. Moreover, removing the separated border districts 19-1 of the dielectric layer 19 adjacent to the carrier 102 to reveal the border district of the corresponding first metal layer 18 of the first dielectric layer 19 is to ready for interconnecting with one of the separated border districts of the second metal layers 22, 25, 27 in the step (g) shown in FIG. 3G; and FIG. 3G shows step (g), connecting the separated border districts of the first metal layers 12, 15, 18 of the first multi-layer substrate 300 with the separated border districts of the second metal layers 27, 25, 22 of the second multi-layer substrate 400 to form the connection section 120 and complete the hybrid structure of multi-layer substrates of the present invention. Before the formation of the connection section 120, the second multi-layer substrate 400 has already been placed upside down to make the metal layers 27, 25, 22 above the second dielectric layers 26, 23, 20. The interconnection between the first metal layers 12, 15, 18 and the second metal layers 27, 25, 22 respectively can use bonding methods such as tin finish bonding, Eutectic bonding, Anisotropic Conductive Film bonding, Gold-Gold bonding or Gold-Copper bonding; and FIG. 3H shows step (h), connecting a first outer surface and a second outer surface of the multi-layer substrates 300, 400 with a first chip device 100, a second chip device 200 and a third substrate. The connect method can be BGA package, LGA package, PGA package or Wire Bond Package.

Moreover, the sequence of the step (g) and the step (h) can be exchanged but there is no effect on the hybrid structure of multi-layer substrates of the present invention and the function thereof.

Please refer to FIG. 4A to FIG. 4I, which illustrate a flowchart of a method of manufacturing the hybrid structure of multi-layer substrates according to step (a) to step (h) in a fourth embodiment of the present invention.

Figure 4A:
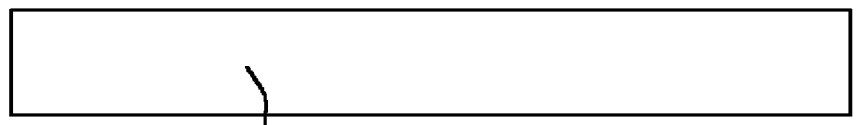
FIG. 4A to FIG. 4I illustrate a flowchart of a method of manufacturing the hybrid structure of multi-layer substrates according to step (a) to step (h) in a fourth embodiment of the present invention.
Figure 4B:
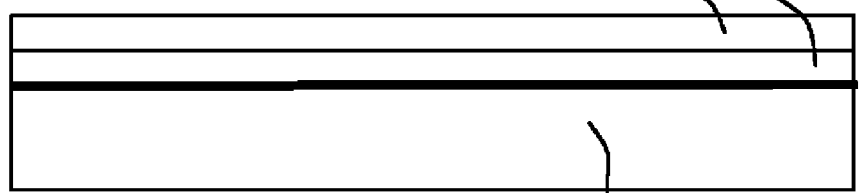
Figure 4C:
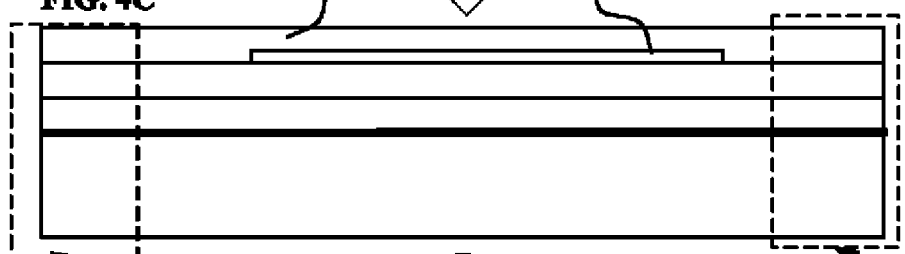
Figure 4D:
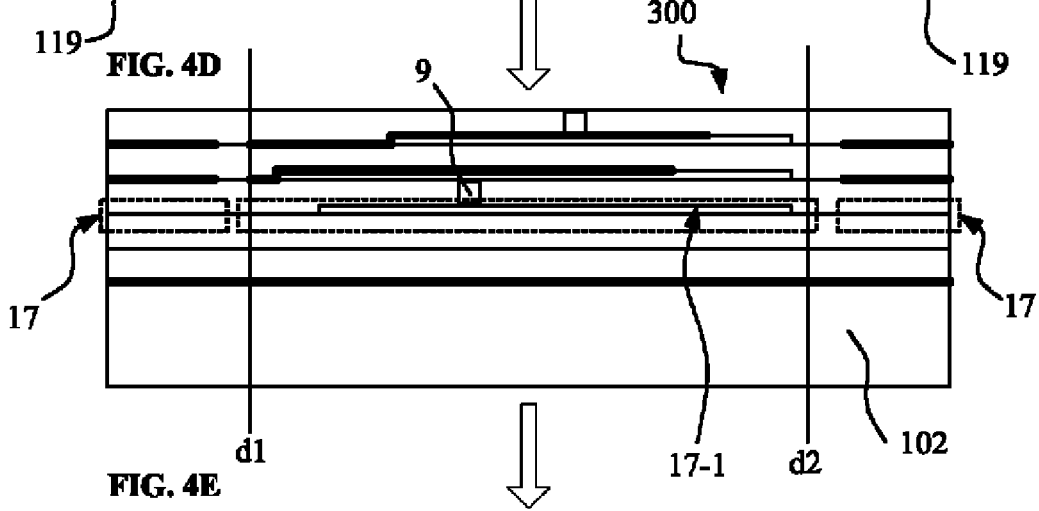
Figure 4E:
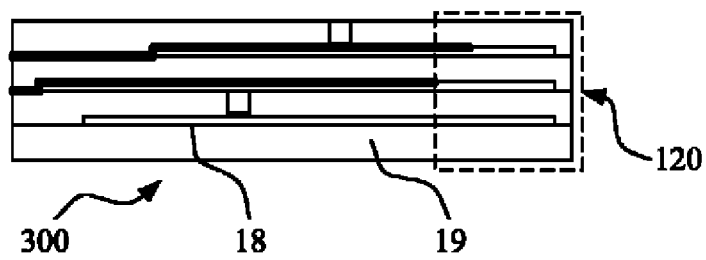
Figure 4F:
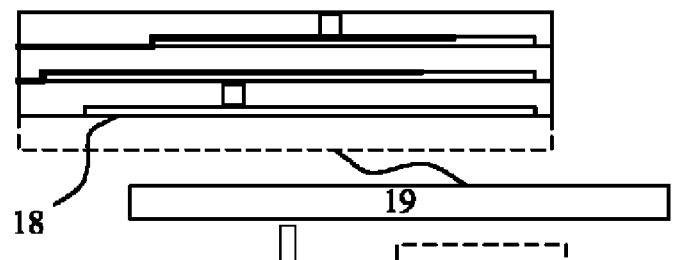
Figure 4G:
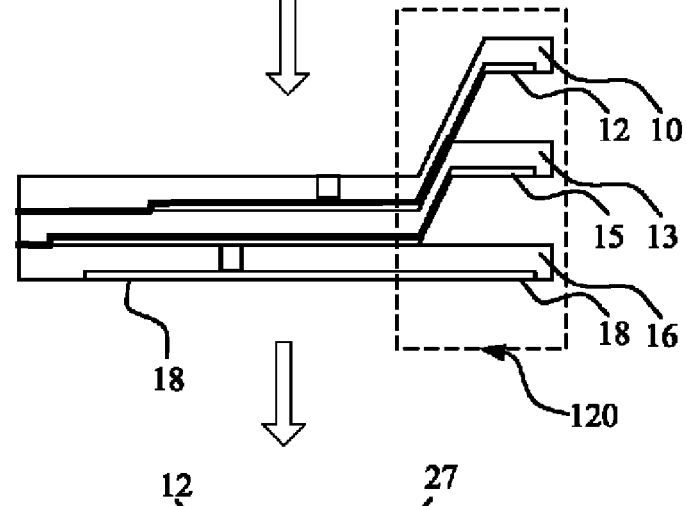
Figure 4H:
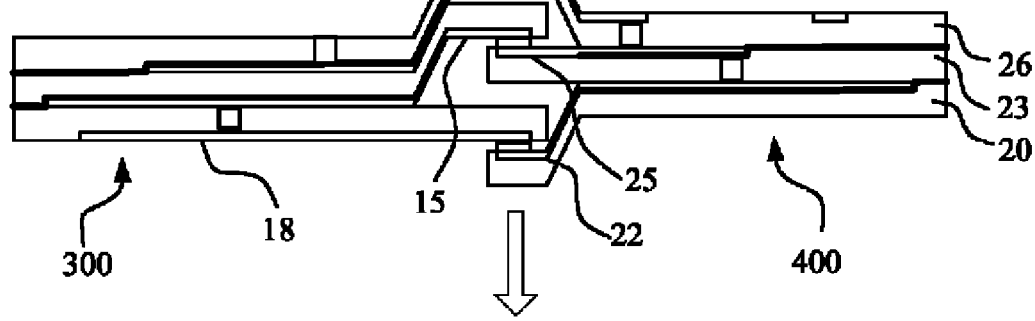
Figure 4I:
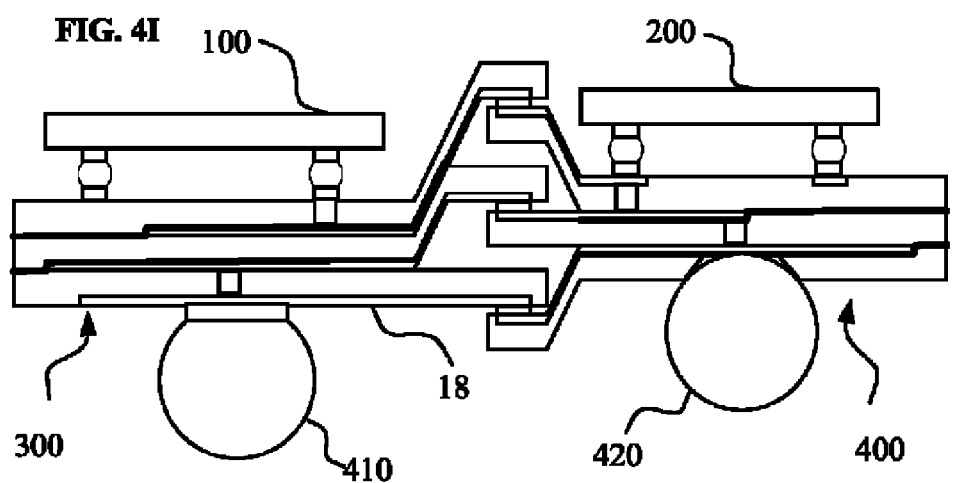

The method of manufacturing the hybrid structure of multi-layer substrates according to the fourth embodiment of the present invention comprises steps below:

FIG. 4A shows step (a), providing a carrier 102 to form one of the multi-layer substrates (taking the first multi-layer substrate 300 for example) thereon;

FIG. 4B shows step (b), implementing an interface adhesion enhancing process on the surface of the carrier 102 to increase adhesion intensity between the carrier 102 and a dielectric layer 104 and coating another dielectric layer 19 after hardening the dielectric layer 104;

FIG. 4C shows step (c), forming a necessary VIA 9 (shown in FIG. 4D) or more in the first dielectric layer 19 and a first metal layer 18 on the first dielectric layer 19 and then coating another first dielectric layer 16;

FIG. 4D shows step (d), repeating step (c) to form the first multi-layer substrate 300 but an interface adhesion enhancing process is not implemented on districts 17, 17-1;

FIG. 4E shows step (e), dividing border districts 119 of the carrier 102 and the first multi-layer substrate 300 thereon alongside the edges of separated border districts 120 (alongside the vertical lines d1, d2 shown in FIG. 4D) to separate the first multi-layer substrate 300 from the carrier 102 and the dielectric layer 104 at once due to the interface adhesion enhancing process implemented between the dielectric layer 104 (shown in FIG. 4B) and the carrier 102 (shown in FIG. 4B);

FIG. 4F shows step (e'), removing the first dielectric layer 19 to reveal the corresponding first metal layer 18 of the first dielectric layer 19;

FIG. 4G shows step (f), separating the border districts of the first metal layers connecting with the border districts of the corresponding first dielectric layers (10 connecting with 12, 13 connecting with 15, 16 connecting with 18) from one another ready to form a connection section 120;

FIG. 4H shows step (g), connecting the separated border districts of the first metal layers 12, 15, 18 of the first multi-layer substrate 300 with the separated border districts of the second metal layers 27, 25, 22 of the second multi-layer substrate 400 to form the connection section 120 and complete the hybrid structure of multi-layer substrates of the present invention. Before the formation of the connection section 120, the second multi-layer substrate 400 has already been placed upside down to make the metal layers 27, 25, 22 above the second dielectric layers 26, 23, 20. The interconnection between the first metal layers 12, 15, 18 and the second metal layers 27, 25, 22 respectively can use bonding methods such as tin finish bonding, Eutectic bonding, Anisotropic Conductive Film bonding, Gold-Gold bonding or Gold-Copper bonding; and FIG. 4I shows step (h), connecting a first outer surface and a second outer surface of the multi-layer substrates 300, 400 with a first chip device 100, a second chip device 200 and a third substrate. The connect method can be BGA package, LGA package, PGA package or Wire Bond Package.

Moreover, the sequence of the step (g) and the step (h) can be exchanged but there is no effect on the hybrid structure of multi-layer substrates of the present invention and the function thereof.

Figure 5A:
FIG. 5A to FIG. 5I illustrate a flowchart of a method of manufacturing the hybrid structure of multi-layer substrates according to step (a) to step (h) in a fifth embodiment of the present invention.
Figure 5B:
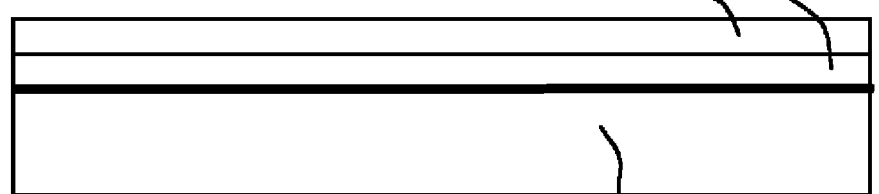
Figure 5C:
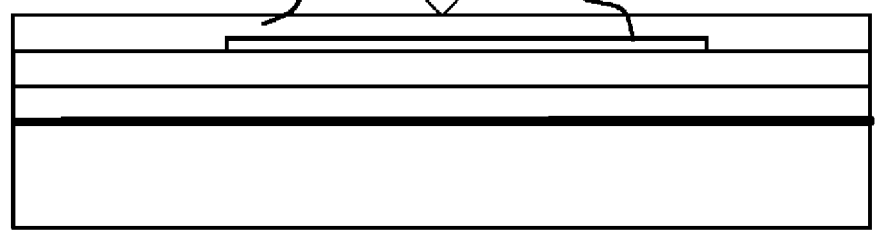
Figure 5D:
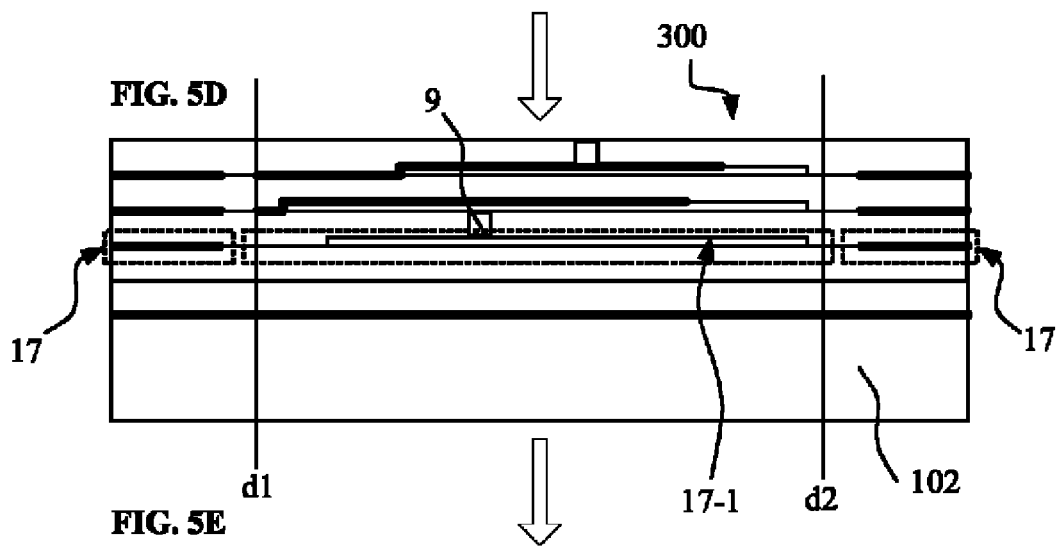
Figure 5E:
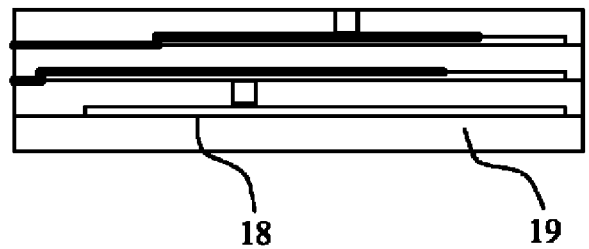
Figure 5F:
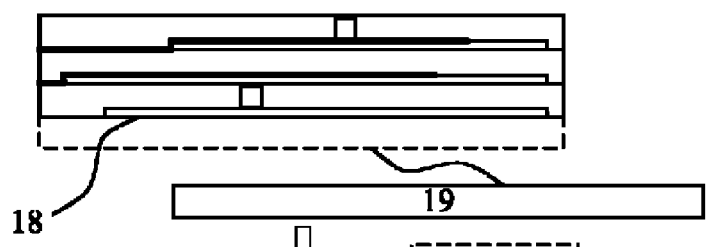
Figure 5G:
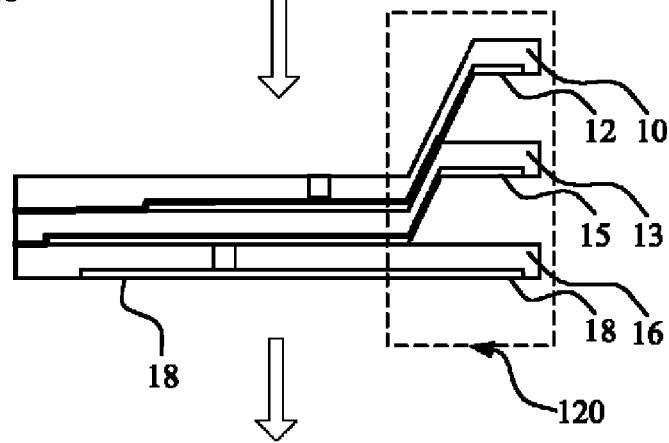
Figure 5H:
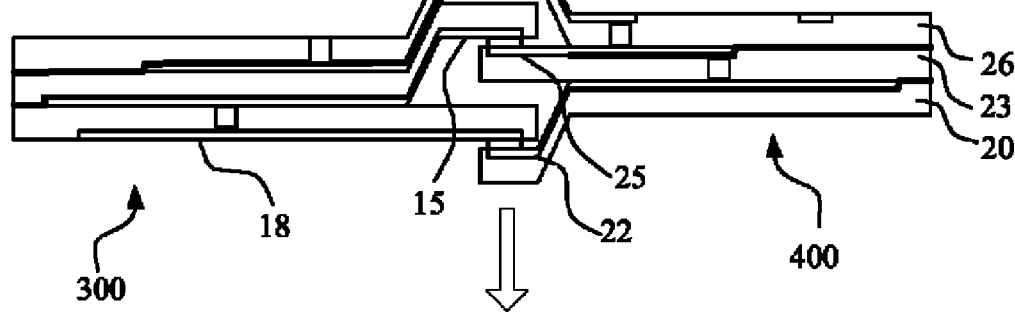
Figure 5I:
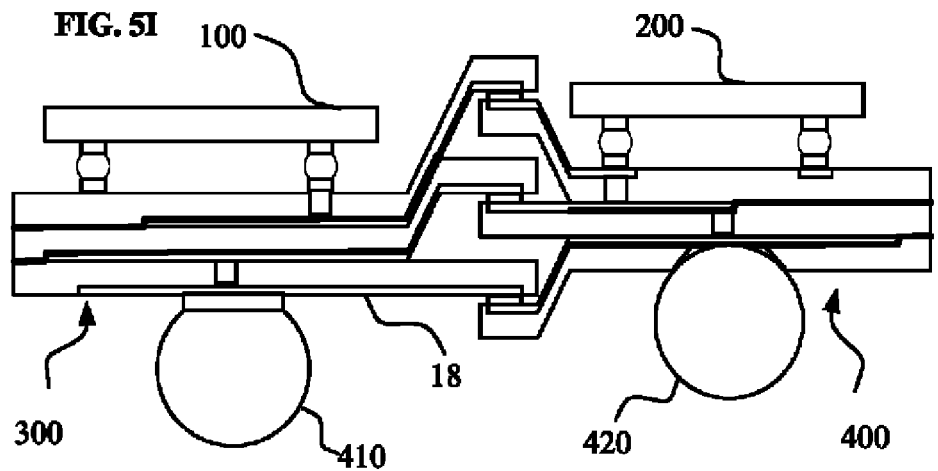

Please refer to FIG. 5A to FIG. 5I. FIG. 5C and FIG. 5D illustrate different step (d) of a fifth embodiment from the fourth embodiment according to the present invention. Besides the steps (c) and (d) which are different, the steps shown in FIGS. 5A, 5B, 5E, 5F, 5G, 5H and 5I are the same as described in the fourth embodiment.

FIG. 5C shows step (c), in the fifth embodiment, an interface adhesion enhancing process is implemented on districts 17 (shown in FIG. 5D) to increase adhesion intensity between the first dielectric layer 19 coated in step (b) and the first dielectric layer 16 after coating the first dielectric layer 19. The aforesaid interface adhesion enhancing process can decrease the possibility that a separation between the dielectric layers 16, 19 or a deformation of the dielectric layers 16, 19 may happen and the dielectric layers 16, 19 may become unfit with each other during the coming step (d) shown in FIG. 5D. Therefore, the yield of manufacturing the hybrid structure of multi-layer substrates can be improved.

Moreover, the sequence of the step (g) and the step (h) can be exchanged but there is no effect on the hybrid structure of multi-layer substrates of the present invention and the function thereof.

Please refer to FIG. 6A to FIG. 6H. FIG. 6C to FIG. 6H illustrate different step (c) to step (g) of a sixth embodiment from the fourth embodiment according to the present invention.

Figure 6A:
FIG. 6A to FIG. 6H illustrate a flowchart of a method of manufacturing the hybrid structure of multi-layer substrates according to step (a) to step (h) in a sixth embodiment of the present invention.
Figure 6B:
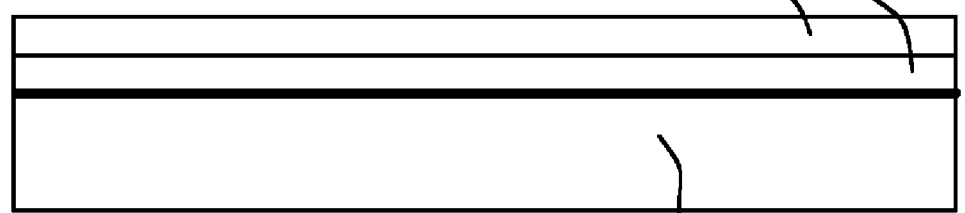
Figure 6C:
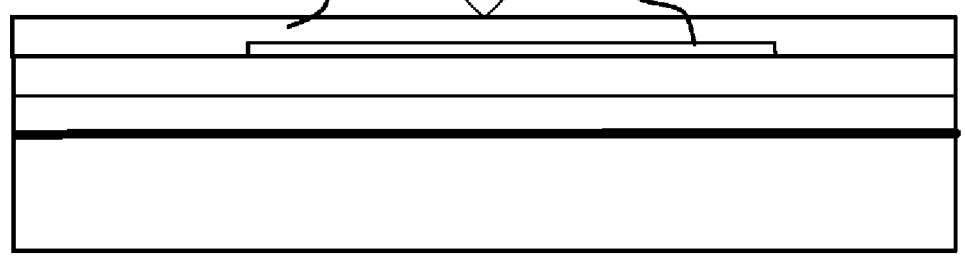
Figure 6D:
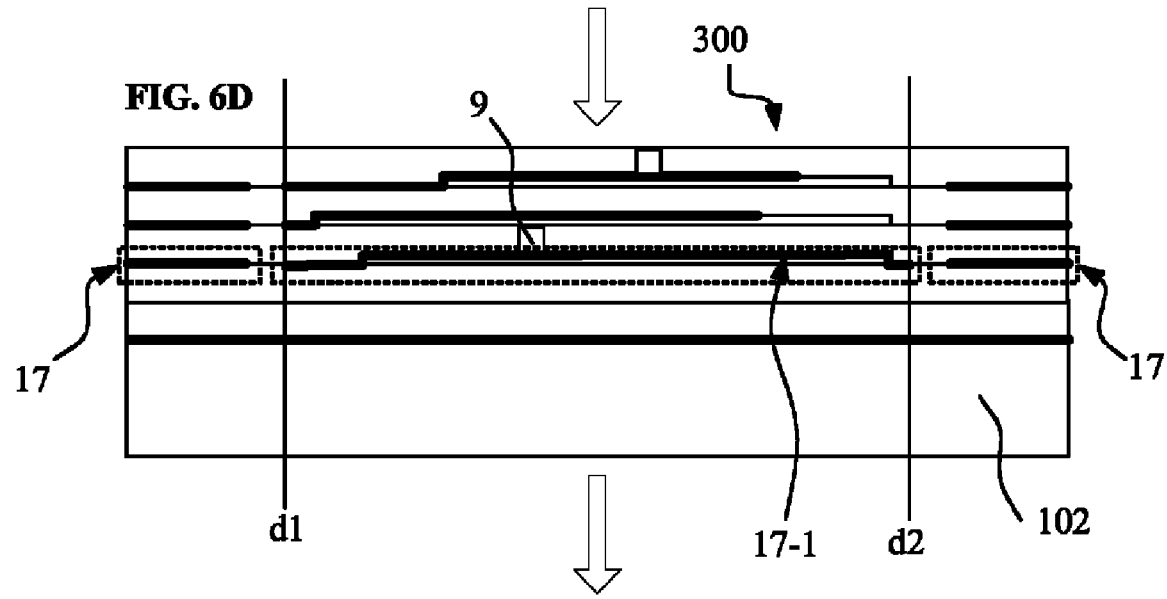
Figure 6E:
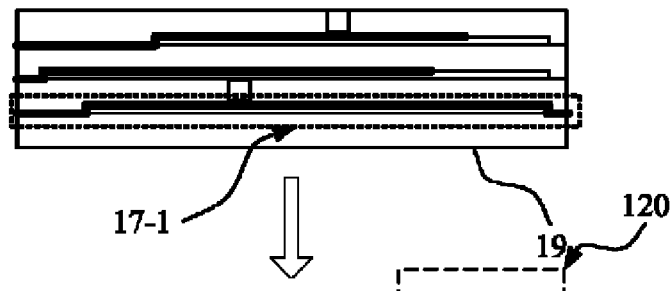
Figure 6F:
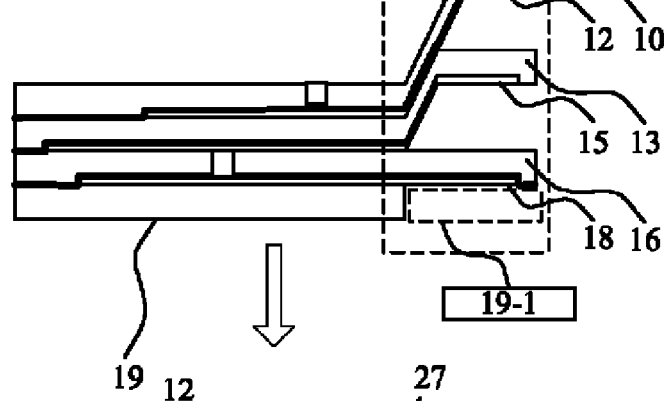
Figure 6G:
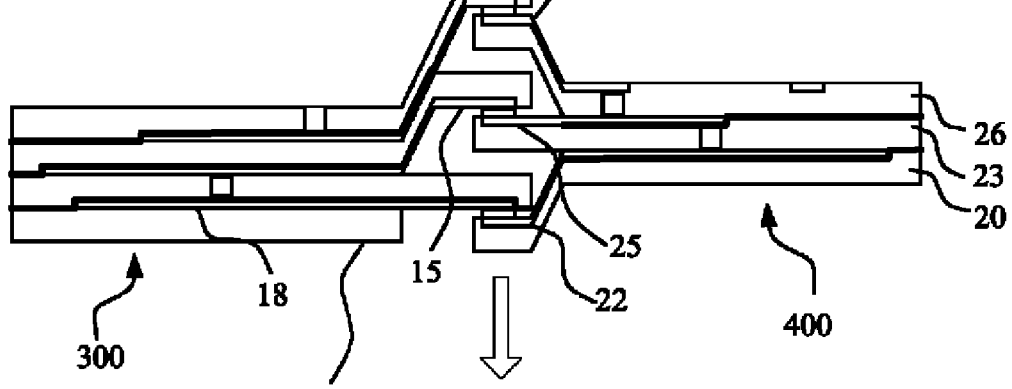
Figure 6H:
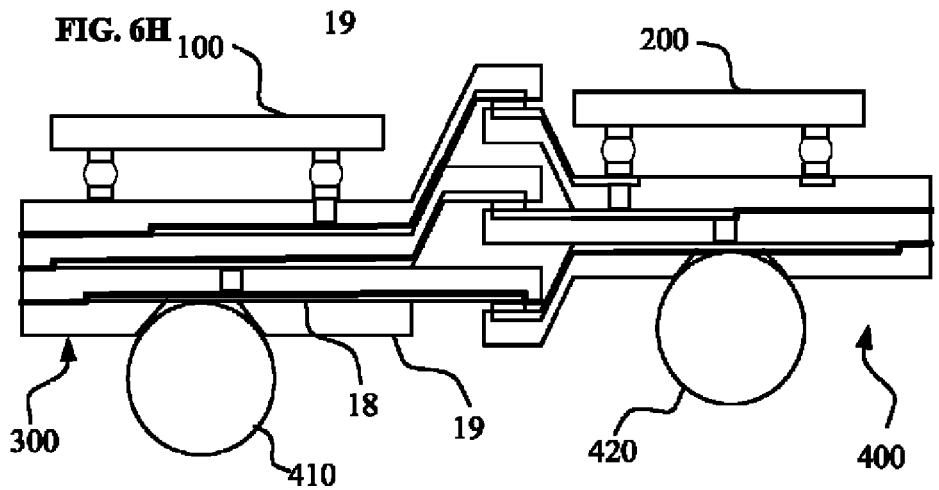

FIG. 6C shows step (c), in the six embodiment, an interface adhesion enhancing process is implemented on districts 17, 17-1 (shown in FIG. 6D) to increase adhesion intensity in these districts between the first dielectric layers 16, 19 before coating the first dielectric layer 16. The aforesaid interface adhesion enhancing process can decrease the possibility that a separation between the first dielectric layers 16, 19 or a deformation of the first dielectric layers 16, 19 may happen and the first dielectric layers 16, 19 may become unfit with each other during the coming step (d) shown in FIG. 6D;

After the step (e), the step (e') is skipped and the step (f) is executed directly after the step (e). The first dielectric layer 19 adjacent to the carrier 102 is not removed;

FIG. 6F shows step (f), separating the border districts of the first metal layers connecting with border districts of the corresponding first dielectric layers (10 connecting with 12, 13 connecting with 15, 16 connecting with 18) from one another ready to form a connection section 120. Moreover, removing the separated border districts 19-1 of the dielectric layer 19 adjacent to the carrier 102 to reveal the border district of the corresponding first metal layer 18 of the first dielectric layer 19 is to ready for interconnecting with one of the separated border districts of the second metal layers 22, 25, 27 in the step (g) shown in FIG. 6G; and FIG. 6G shows step (g), connecting the separated border districts of the first metal layers 12, 15, 18 of the first multi-layer substrate 300 with the separated border districts of the second metal layers 27, 25, 22 of the second multi-layer substrate 400 to form the connection section 120 and complete the hybrid structure of multi-layer substrates of the present invention. Before the formation of the connection section 120, the second multi-layer substrate 400 has already been placed upside down to make the metal layers 27, 25, 22 above the second dielectric layers 26, 23, 20. The interconnection between the first metal layers 12, 15, 18 and the second metal layers 27, 25, 22 respectively can use bonding methods such as tin finish bonding, Eutectic bonding, Anisotropic Conductive Film bonding, Gold-Gold bonding or Gold-Copper bonding; and FIG. 6H shows step (h), connecting a first outer surface and a second outer surface of the multi-layer substrates 300, 400 with a first chip device 100, a second chip device 200 and a third substrate. The connect method can be BGA package, LGA package, PGA package or Wire Bond Package.

Moreover, the sequence of the step (g) and the step (h) can be exchanged but there is no effect on the hybrid structure of multi-layer substrates of the present invention and the function thereof.

Please refer to FIG. 7A to FIG. 7I. FIG. 7D and FIG. 7I illustrate the different steps (d) to step (h) of a seventh embodiment from the first embodiment according to the present invention. Besides the steps (d) and (h), the steps shown in FIG. 7A to FIG. 7C are the same as the first embodiment.

FIG. 7D shows step (d), repeating step (c) to form the first multi-layer substrate 300 and to form the third multi-layer substrate 500 next to the first multi-layer substrate 300 at the same time;

FIG. 7E shows step (e), dividing border districts 119 of the carrier 102 and the first multi-layer substrate 300 thereon alongside the edges of separated border districts 120 (alongside the vertical lines d1, d3 shown in FIG. 7D) but stopping dividing the carrier 102 and the first multi-layer substrate 300 at the first dielectric layer 10 and the first metal layer 12 alongside the vertical line d2 to separate the first multi-layer substrate 300 and the third multi-layer substrate 500 from the carrier 102;

FIG. 7F shows step (e'), removing the first dielectric layer 19 of the first multi-layer substrate 300 and the third multi-layer substrate 500 that is adjacent to the carrier 102 to reveal the corresponding first metal layer 18 of the first dielectric layer 19;

FIG. 7G shows step (f), separating the border districts of the first metal layers connecting with the border districts of the corresponding first dielectric layers (10 connecting with 12, 13 connecting with 15, 16 connecting with 18) of the first multi-layer substrate 300 from one another ready to form a connection section 120 but sharing the first dielectric layer 10 and the first metal layer 12 with the third multi-layer substrate 500. The dielectric layers and the metal layers of the third multi-layer substrate 500 are not separated;

FIG. 7H shows step (g), same as the first embodiment, connecting the separated border districts of the first metal layers 12, 15, 18 of the first multi-layer substrate 300 with the separated border districts of the second metal layers 27, 25, 22 of the second multi-layer substrate 400 to form the connection section 120. Connecting the second multi-layer substrate 400 and the third multi-layer substrate 500 thereafter can also be illustrated; and FIG. 7I shows step (h), connecting a first outer surface and a second outer surface of the multi-layer substrates 300, 400 with a first chip device 100, a second chip device 200 and a third substrate. The connect method can be BGA package, LGA package, PGA package or Wire Bond Package. What is different from the first embodiment, the second chip device is connected with the third multi-layer substrate 500. Accordingly, a multiple hybrid structure of multi-layer substrates of the present invention provides a flexible concept for manufacturing the hybrid structure of the multi-layer substrates.

Moreover, the sequence of the step (g) and the step (h) can be exchanged but there is no effect on the hybrid structure of multi-layer substrates of the present invention and the function thereof.

Figure 8:
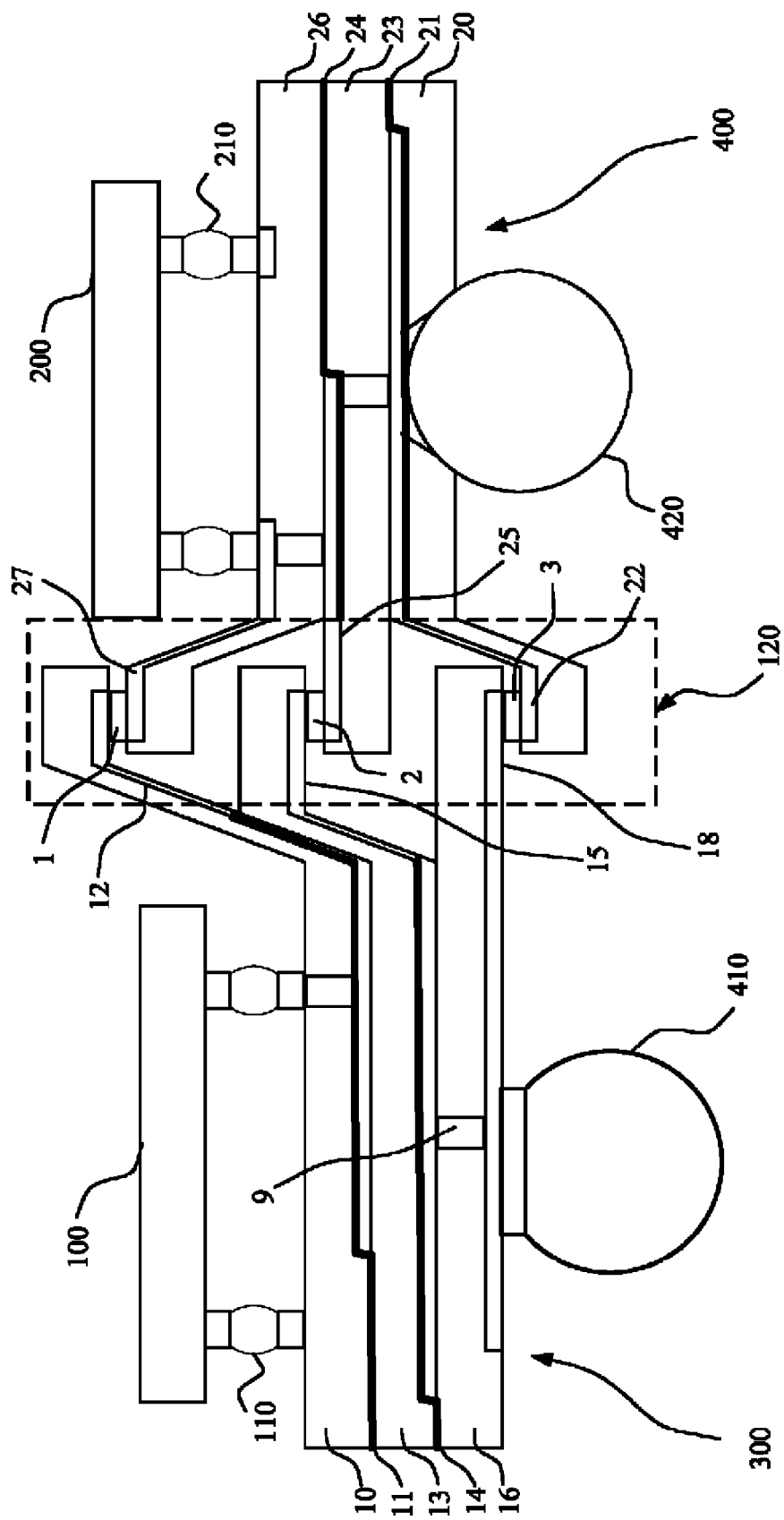
FIG. 8 illustrates a profile drawing of a hybrid structure of multi-layer substrates according to first, second, fourth and fifth embodiments of the present invention.

Please refer to FIG. 8, which illustrates a profile drawing of a hybrid structure of multi-layer substrates according to first, second, fourth and fifth embodiments of the present invention.

The hybrid structure of multi-layer substrates of the present invention at least comprises a first multi-layer substrate 300 and a second multi-layer substrate 400. The first outer surface of the first multi-layer substrate 300 is connected with the first chip device 100. The first outer surface of the second multi-layer substrate 400 is connected with the second chip device 200. Either the first chip device 100 or the second chip device 200 can be a logic circuit component, a memory, an analog component, an optoelectronic component, a micro-electric mechanical component or a luminous component.

The hybrid structure of multi-layer substrates may further comprise a third substrate (such as shown in FIG. 7I). The third substrate can be connected with the first multi-layer substrate 300 through the Ball Mount 410 or can be connected with the second multi-layer substrate 400 through the Ball Mount 420. Alternatively, the third substrate can be connected with first chip device 100 or the second chip device 200. The connect method for the third substrate can be BGA package, LGA package, PGA package or Wire Bond Package.

Furthermore, all of the first multi-layer substrate 300, the second multi-layer substrate 400 and the third substrate can be flexible substrates. A flexible package provided by the hybrid structure of multi-layer substrates of the present invention can be employed as the connect method for the flexible substrates.

The first multi-layer substrate 300 comprises a plurality of first metal layers 12, 15, 18 and a plurality of first dielectric layers 10, 13, 16. The second multi-layer substrate 400 comprises a plurality of second metal layers 22, 25, 27 and a plurality of second dielectric layers 20, 23, 26. Moreover, the first chip device 100 is connected with the VIA in the first dielectric layer 10 of the first multi-layer substrate 300 with Ball mount 110. The second chip device 200 is connected with the VIA in the second dielectric layer 26 or with the second metal layer 27 of the second multi-layer substrate 400 with Ball mount 210.

The border districts of first metal layer 12 and the corresponding first dielectric layer 10, the border district of first metal layer 15 and the corresponding first dielectric layer 13, the border district of first metal layer 18 and the corresponding first dielectric layer 16 are separated from adjacent first metal layers and adjacent first dielectric layers respectively. Similarly, the border district of second metal layer 22 and the corresponding second dielectric layer 20, the border district of second metal layer 25 and the corresponding second dielectric layer 23, the border district of second metal layer 27 and the corresponding second dielectric layer 26 are respectively separated from adjacent second metal layers and adjacent second dielectric layers.

Before the hybrid structure of the first multi-layer substrate 300 and the second multi-layer substrate 400 is going to be manufactured, the second multi-layer substrate 400 has already been placed upside down to make the border districts of the metal layers 27, 25, 22 connected with the border districts of the first metal layers 12, 15, 18 respectively to form a connection section 120 as shown in FIG. 8. The interconnections between the first metal layers 12, 15, 18 and the second metal layers 27, 25, 22 respectively can use respective bonders 1, 2, 3 or direct bonding method such as tin finish bonding, Eutectic bonding, Anisotropic Conductive Film bonding, Gold-Gold bonding or Gold-Copper bonding.

Through aforesaid interconnections, the second metal layers 27, 25, 22 joint the first metal layers 12, 15, 18 respectively as respective unified metal layers. With such hybrid structure of the multi-layer substrates, the first chip device 100 and the second chip device 200 are connected with each other directly without a shared package substrate.

According to prior arts, the aforesaid multi-layer substrates need to be connected with a shared package substrate without separating the border districts thereof but the present invention uses the separated border districts of the first multi-layer substrate 300 and the second multi-layer substrate 400 to manufacture the hybrid structure therebetween, therefore, the present invention can increase the package integration and microminiaturize a entire system of the chip devices and the multi-layer substrates. Furthermore, the present invention provides a flexible package for application of a flexible electronic system.

Moreover, an interface adhesion enhancing process is implemented between the first dielectric layers and second dielectric layers. Such as the districts 11, 14, 21 and 24 implemented interface adhesion enhancing process are indicated with rougher lines. Specifically, an interface adhesion enhancing process is implemented on the rest districts between the metal layers and the corresponding dielectric layers except the separated border districts (i.e. except the connection section 120) to increase adhesion intensity on the rest districts. Alternatively, an interface adhesion weakening process is implemented on the border districts to decrease adhesion intensity thereon. Hence, the border districts of the multi-layer substrates shown in the connection section 120 can be easily separated from the other adjacent border districts of the layers.

The way to separate the border districts of the multi-layer substrates can be using two adhesive tapes (such as UV tape) to stick on the first outer surface and the second outer surface of the first multi-layer substrate 300 or the second multi-layer substrate 400, first; and then, rending the two tapes to separate the border districts which are not implemented with the interface adhesion enhancing process. Repeating the sticking and rending procedures, the border districts of the layers which are not implemented with the interface adhesion enhancing process can be separated. However, the metal layers 12, 15, 18, 22, 25, 27 are connected with the dielectric layers 10, 13, 16, 20, 23, 26. With a concept of selective interface adhesion enhancing process between the dielectric layers, the hybrid structure of the first multi-layer substrate 300 and the second multi-layer substrate 400 can be accomplished. For example, material of the dielectric layers is polyimide; the aforesaid interface adhesion enhancing process can be an oxygen or argon plasma process.

Figure 9:
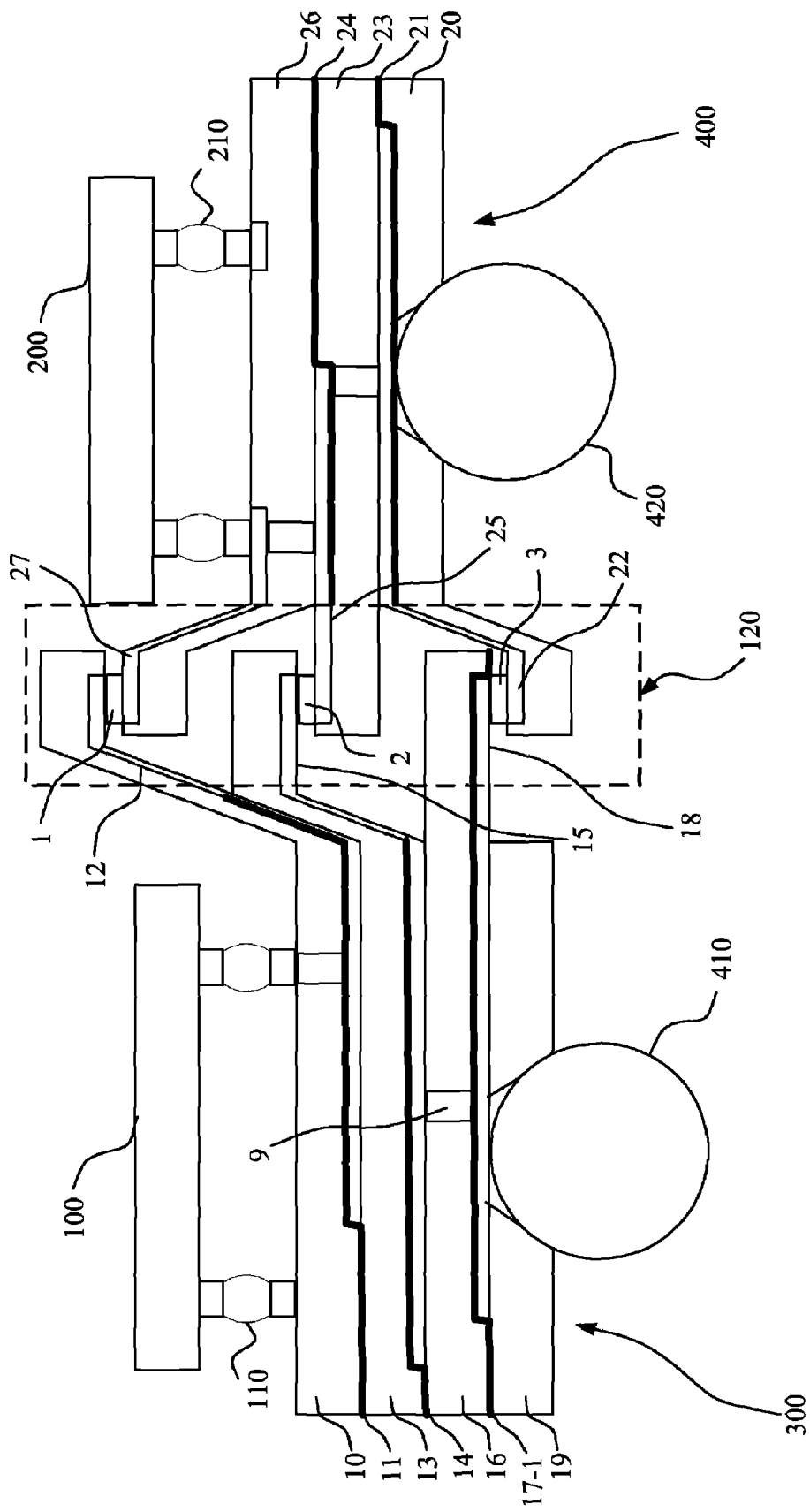
FIG. 9 illustrates a profile drawing of a hybrid structure of multi-layer substrates according to third and sixth embodiments of the present invention.

Please refer to FIG. 9, which illustrates a profile drawing of a hybrid structure of multi-layer substrates according to third and sixth embodiments of the present invention. The difference from the first, second, fourth and fifth embodiments is an interface adhesion enhancing process is not implemented on the districts 17-1 before coating the dielectric layer 16 during the step (c) because a different Pad of package type can be an option for connecting with the third substrate. In these embodiments of the present invention, connecting the separated borders of the first metal layers 12, 15, 18 of first multi-layer substrate 300 with the separated border districts of the second metal layers 27, 25, 27 of the second multi-layer substrate 400 is illustrative rather than limiting of the present invention. Selective connections, one to many connections, or many to one connections among the first metal layers 12, 15, 18 and the second metal layers 27, 25, 2 all can be considered.

In conclusion, the present invention provides the method of manufacturing the hybrid structure of the multi-layer substrates and the hybrid structure thereof to connect different kinds of chip devices directly without the shared package substrate for increasing the package integration and microminiaturizing an entire system of the chip devices and the multi-layer substrates. The hybrid structure of multi-layer substrates according to the present invention can reduce the package volume of the entire system for increasing the package integration and further provide a flexible package for application of a flexible electronic system. Comparing to prior arts, the present invention has high integration and high package integration of System-In-Package either for the package among chip devices or for package among multi-layer substrates.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structure.

What is claimed is:

1. A hybrid structure of multi-layer substrates, comprising:
a first multi-layer substrate, stacking up a plurality of first metal layers and a plurality of first dielectric layers alternately that a border district of at least one first metal layer connects with a border district of at least one corresponding first dielectric layer and the border districts are separated from adjacent first metal layers and adjacent first dielectric layers; and
a second multi-layer substrate, stacking up a plurality of second metal layers and a plurality of second dielectric layers alternately that a border district of at least one second metal layer connects with a border district of at least one corresponding second dielectric layer and the border districts are separated from adjacent second metal layers and adjacent second dielectric layers wherein at least one first metal layer is connected with at least one second metal layer to form a connection section.

2. The hybrid structure of claim 1, wherein an interface adhesion enhancing process is implemented on rest districts between the first metal layers and the corresponding first dielectric layers except the border districts thereof to increase adhesion intensity on the rest districts.

3. The hybrid structure of claim 2, wherein the first multi-layer substrate corresponding to the rest districts comprises the first metal layers.

4. The hybrid structure of claim 2, wherein the first multi-layer substrate corresponding to the rest districts comprises at least one VIA at the first dielectric layers.

5. The hybrid structure of claim 1, wherein the material of the first dielectric layers is polyimide.

6. The hybrid structure of claim 1, wherein an interface adhesion enhancing process is implemented on rest districts between the second metal layers and the corresponding second dielectric layers except the border districts thereof to increase adhesion intensity on the rest districts.

7. The hybrid structure of claim 6, wherein the second multi-layer substrate corresponding to the rest districts comprises the second metal layers.

8. The hybrid structure of claim 6, wherein the second multi-layer substrate corresponding to the rest districts comprises at least one VIA at the second dielectric layers.

9. The hybrid structure of claim 1, wherein the material of the second dielectric layers is polyimide.

10. The hybrid structure of claim 1, further comprising a first chip device to be connected to the first multi-layer substrate.

11. The hybrid structure of claim 10, further comprising a third substrate to connect the first chip device.

12. The hybrid structure of claim 1, further comprising a second chip device to be connected to the second multi-layer substrate.

13. The hybrid structure of claim 12, further comprising a third substrate to connect the second chip device.

14. The hybrid structure of claim 1, further comprising a third substrate to connect one of the first multi-layer substrate and the second multi-layer substrate.

15. The hybrid structure of claim 14, wherein the third substrate is a flexible substrate.

16. The hybrid structure of claim 1, wherein the first multi-layer substrate is a flexible substrate.

17. The hybrid structure of claim 1, wherein the second multi-layer substrate is a flexible substrate.

18. A multi-layer substrate comprising:
a plurality of metal layers; and
a plurality of dielectric layers, stacking up with the metal layers alternately that a border district of at least one first metal layer connects with a border district of the corresponding dielectric layer and the border districts are separated from adjacent metal layers and adjacent dielectric layers wherein the border district of at least one metal layer is connected with at least one metal layer of another multi-layer substrate to form a connection section.

* * * * *